(12) United States Patent
Enea et al.

(10) Patent No.: US 7,936,047 B2
(45) Date of Patent: May 3, 2011

(54) METHOD FOR REALIZING A CONTACT OF AN INTEGRATED WELL IN A SEMICONDUCTOR SUBSTRATE, IN PARTICULAR FOR A BASE TERMINAL OF A BIPOLAR TRANSISTOR, WITH ENHANCEMENT OF THE TRANSISTOR PERFORMANCES

(75) Inventors: Vincenzo Enea, Catania (IT); Cesare Ronsisvalle, San Giovanni La Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 414 days.

(21) Appl. No.: 12/039,610

(22) Filed: Feb. 28, 2008

(65) Prior Publication Data
US 2008/0246118 A1 Oct. 9, 2008

(30) Foreign Application Priority Data
Mar. 1, 2007 (IT) .............................. MI2007A0405

(51) Int. Cl.
*H01L 29/73* (2006.01)

(52) U.S. Cl. .............. 257/577; 257/578; 257/E21.135; 438/546

(58) Field of Classification Search .................. 257/378, 257/577, E21.135, E29.174, 578; 438/546
See application file for complete search history.

(56) References Cited

U.S. PATENT DOCUMENTS
6,121,640 A * 9/2000 Leonardi ........................ 257/137
* cited by examiner

*Primary Examiner* — Thinh T Nguyen
(74) *Attorney, Agent, or Firm* — Lisa K. Jorgenson; Robert Iannucci; Seed IP Law Group PLLC

(57) ABSTRACT

A method realizes a contact of a first well of a first type of dopant integrated in a semiconductor substrate next to a second well of a second type of dopant and forming with it a parasitic diode. The method comprises: formation of the first well; formation of the second well next to the first well; definition of an oxide layer above the first and second wells; and formation of an electric contact layer above the oxide layer in correspondence with the first well for realizing an electric contact with it. The definition step of the oxide layer further comprises a deposition step of this oxide layer above the whole first well and a removal step of at least one portion of the oxide layer in correspondence with a contact area of the first well so that the contact area has a shorter length than a length of the first well.

11 Claims, 4 Drawing Sheets

14,21-Al
10-poly
15-SiO2
7,7a-Si

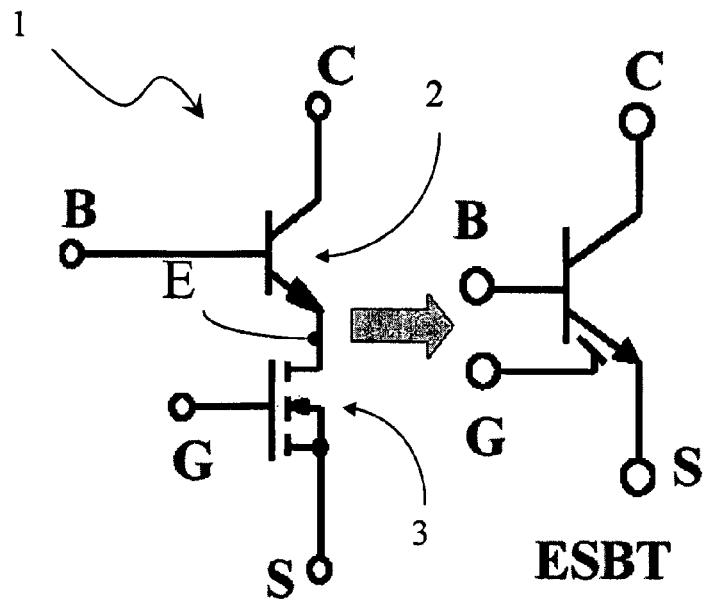
FIG. 1A
(Prior Art)
FIG. 1B
(Prior Art)
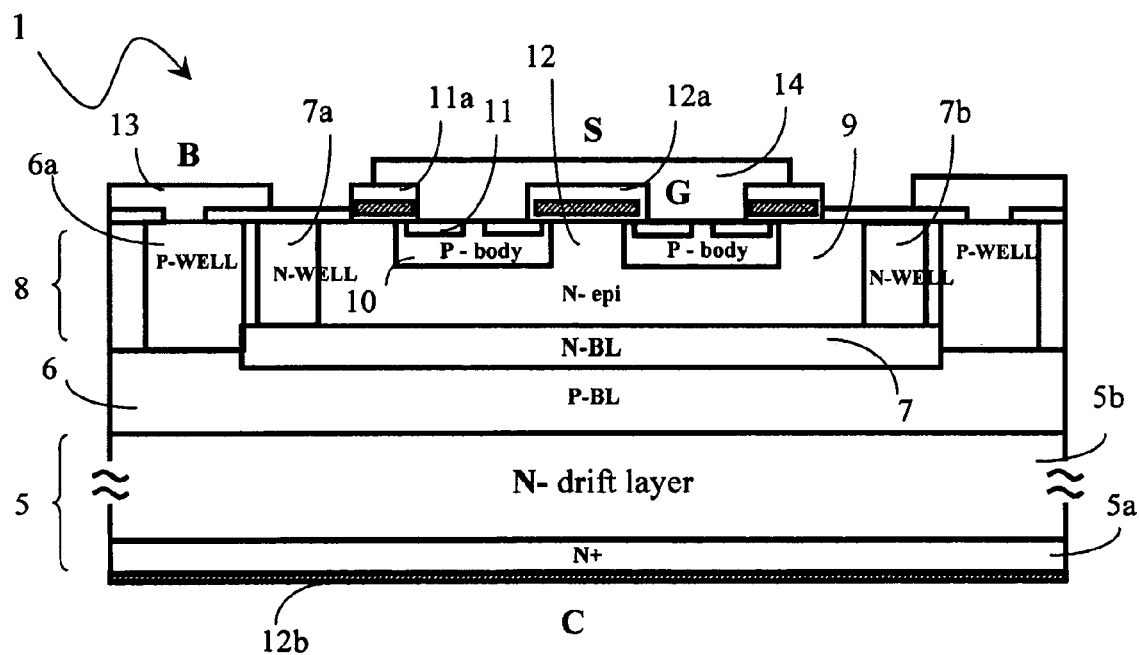
FIG. 2
(Prior Art)

METHOD FOR REALIZING A CONTACT OF AN INTEGRATED WELL IN A SEMICONDUCTOR SUBSTRATE, IN PARTICULAR FOR A BASE TERMINAL OF A BIPOLAR TRANSISTOR, WITH ENHANCEMENT OF THE TRANSISTOR PERFORMANCES

BACKGROUND

1. Technical Field

The present invention relates to a method for realizing a contact of a well, integrated in a semiconductor substrate, in particular for a base terminal of a bipolar transistor.

More specifically, the invention relates to a method for realizing a contact of a first well of a first type of dopant, integrated in a semiconductor substrate, next to a second well of a second type of dopant and forming with it a parasite diode.

The invention also relates to bipolar transistor and to a power actuator of the emitter-switched type comprising at least one high voltage bipolar transistor.

2. Description of the Related Art

As it is well known, a power actuator of the emitter-switched type is an electronic device able to supply a low voltage drop in conduction together with a high operative frequency.

In particular, as schematically shown in FIG. 1A, a power actuator of the emitter-switched type, globally indicated with 1, essentially comprises a high voltage bipolar transistor 2 and a low voltage DMOS transistor 3 connected in "cascode" configuration. In this way, the power actuator 1 has a collector terminal C, a base terminal B, a gate terminal G and a source terminal S. Such a power actuator is frequently indicated as ESBT® and represented by the equivalent circuit of FIG. 1B.

Thanks to the cascode configuration of the high voltage bipolar transistor 2 and of the low voltage DMOS transistor 3, the power actuator 1 has a low voltage drop in conduction and a high operative frequency, peculiarity that is more and more accentuated as the "voltage rating" of the actuator itself increases.

It is possible to integrate monolithically a power actuator 1 of the described type, as schematically shown in FIG. 2.

In particular, the monolithically integrated power actuator 1 comprises a substrate 5, realized by a first layer 5a heavily doped with a first type of dopant, in particular N, overlapped by a second layer 5b slightly doped with the first type of dopant N, commonly indicated as drift layer.

Above the substrate 5, a first buried layer 6 of a second type of dopant, in particular P, is realized, wherein a second buried layer 7 of the first type of dopant N, is then realized, in turn overhung by an epitaxial layer 8 of the first type of dopant N.

In the epitaxial layer 8, a low resistivity first 7a and second wells 7b of the first type of dopant N are realized suitable for contacting the second buried layer 7.

This second buried layer 7 and the wells 7a and 7b enclose a portion 9 of the epitaxial layer 8 wherein are formed first islands 10 of the second type of dopant P. Active areas of an elemental cell of the DMOS type are suitably realized, in particular in a second island 11 of the second type of dopant P, in turn realized in the first island 10 and overhung by at least one first contact structure 11a.

A second contact structure 12a is realized above the portion 9 of the epitaxial layer 8, in correspondence with a tunnel region 12 of the elemental cell of the DMOS type.

Finally, the monolithically integrated power actuator 1 comprises a contact layer 12b, below the substrate 5, a first metallization layer 13 overhanging the well 6a and a second metallization layer 14 overhanging the first contact structure 11a and second contact structure 12a.

In this way, the high voltage bipolar transistor 2 comprises a collector region realized by the drift layer 5b and contacted, by means of the first heavily doped layer 5a of the substrate 5 and the contact layer 12b, a base region realized by the first buried layer 6 and contacted by means of a well 6a of the second type of dopant P and the first metallization layer 13 and an emitter region realized by the second buried layer 7 and contacted by means of the well 7a.

Hereafter the first buried layer 6 will be indicated as base region B and the second buried layer 7 as emitter region E, and the well 6a as base contact well and the well 7a as emitter contact well, this latter well being not contacted by a metal line. Further, the first metallization layer 13 will be indicated as base contact.

Moreover, the low voltage DMOS transistor 3 comprises a drain region coinciding with the emitter region E of the high voltage bipolar transistor 2 and realized by the portion 9 of the epitaxial layer 8, a source region S realized by the second island 11 and contacted by means of the first contact structure 11a and the second metallization layer 14, a body region realized by the first island 10 and a control gate G realized by the second contact structure 12a.

Hereafter then the first island will be indicated as body region, the second island 11 as source region and the first contact structure 11a as source contact structure, and the second contact structure 12a as gate contact structure. Further, the second metallization layer 14 will be indicated as source contact.

The monolithically integrated power actuator 1, as shown in FIG. 2, also has a symmetrical structure wherein the same regions, active areas and contact structures are arranged symmetrically with respect to the control gate G.

It is to be noted that this power actuator 1 however contains different parasitic components which worsen the performances.

The more insidious parasitic component is a parasitic diode, in particular a diode Dp connected between the base B and emitter E regions of the bipolar transistor 2, schematically shown in FIG. 3A, by means of its circuit equivalent, and in FIG. 3B, which shows an enlarged view of a portion of the monolithically integrated power actuator 1, as shown in FIG. 2.

It is to be noted that the figures showing schematic views of portions of the monolithically integrated power actuator 1 are not drawn to scale, but are instead drawn so as to highlight the important features of the description.

The efficiency level of this parasitic diode Dp easily causes such a worsening of the electric performances of the power actuator 1 that, during the design step of the corresponding integrated structure, an optimization work of the sizes, of the positions and of the doping of the portions constituting the parasitic diode Dp itself, in particular the wells 6a and 7a, respectively P-well and N-well, becomes mandatory so as to minimize the efficiency and in consequence its negative effects on the power actuator 1.

In reality, simulations carried out by the Applicant itself have proved that also a suitable design of the wells 6a and 7a is not enough to ensure a correct operation of the power actuator 1 due to the parasitic diode Dp.

In particular, by means of simulations of the flow lines of the current of electrons under direct bias conditions of the parasitic diode Dp, it has been verified that only a part of the electrons coming from the source region S of the DMOS transistor 3 succeed in being correctly used by the emitter region E, in particular the second buried layer 7, of the bipolar transistor 2 for sustaining the gain thereof, while a part of these electrons, which particularly move towards the first metallization layer 13, i.e., the contact of the base terminal B, through the parasitic diode Dp, withdraws a non-negligible amount of current from the bipolar transistor 2 thus creating a parasitic current and maintaining the worsening of the performances of the power actuator 1 at an unacceptable level.

In order to better understand the subdivision of the flow of electrons in correspondence with the P-well/N-well junction of the wells 6a and 7a which realize the parasitic diode Dp it is possible to refer to FIGS. 4A and 4B where an axonometrical view of an integrated structure of the power actuator 1, in particular in correspondence with its base terminal B and then with the parasitic diode Dp, is shown.

In particular, it is immediately verified that this flow of electrons occurs in correspondence with a contact area Zc (indicated by arrows in FIG. 4A) in correspondence with the junction between the first metallization layer 13 and the base contact well 6a, corresponding to a contact portion 13A, in particular a flat portion, of this first metallization layer 13 directly into contact, without oxide interposition, with the base contact well 6a.

To better highlight this contact area Zc, in FIG. 4A the integrated structure of the power actuator 1 has been shown making both the first metallization layer 13 and the corresponding oxide portion 15 above the silicon transparent. In this way it is possible to easily recognize the P-well/N-well junction along a depth size Z of the integrated structure of the power actuator 1.

It is then shown how the distance of this P-well/N-well junction from the contact area Zc on the P-well 6a, in particular the extreme contact point Ec between the first metallization layer 13 and the oxide portion 15, is always constant, and equal in particular to Dl, as indicated in FIG. 4B, is mainly responsible for the migration of electrons towards the contact of the base terminal and then for the parasitic current of the parasitic diode Dp, which heavily limits the performances of the power actuator 1 thus realized.

BRIEF SUMMARY

One embodiment is an integrated structure of a power actuator, having such structural and functional features as to overcome the limits still affecting the devices realized according to the prior art.

One embodiment realizes a contact of a well of a first type of dopant integrated in a semiconductor substrate next to a further well of a second type of dopant and forming with it a parasitic diode, such contact being suitably shaped so as to reduce its extension with respect to the length of the well, thus reducing the parasitic current of the parasitic diode, in particular in the case of the P-well/N-well junction which is created between the base contact well and the emitter contact well of a bipolar transistor, for example comprised in a power actuator.

One embodiment is a method for realizing a contact of a first well of a first type of dopant integrated in a semiconductor substrate next to a second well of a second type of dopant and forming with it a parasitic diode, the method comprising the steps of:
formation of said first well;
formation of said second well next to said first well;
definition of an oxide layer above said first and second wells; and formation of an electric contact layer above said oxide layer in correspondence with at least said first well for realizing an electric contact therewith wherein said definition step of said oxide layer further comprises a deposition step of said oxide layer above said whole first well and a removal step of at least one portion of said oxide layer in correspondence with a contact area of said first well so that said contact area has shorter length than a length of said first well.

One embodiment is a bipolar transistor integrated in a semiconductor substrate, of the type comprising at least one first buried layer realized in said semiconductor substrate and having function of base region, a second buried layer realized in said first buried layer and having function of emitter region, as well as respectively a first base contact well and a second emitter contact well adjacent to each other and forming a parasitic diode wherein it further comprises an oxide layer realized above said first and second wells and suitably configured so as to define a contact area of said first base contact well having a shorter length than a length of said first well, as well as an electric contact layer, formed above said oxide layer and in direct contact with said first base contact well in correspondence with said contact area.

One embodiment is a power actuator of the emitter-switched type integrated in a semiconductor substrate and comprising at least one high voltage bipolar transistor and one low voltage DMOS transistor connected in cascode configuration between a collector terminal of said bipolar transistor and a source terminal of said DMOS transistor and having respective control terminals, said high voltage bipolar transistor comprising at least one first buried layer realized in said semiconductor substrate and having function of base region, one second buried layer realized in said first buried layer and having function of emitter region, as well as respectively one first base contact well and one second emitter contact well adjacent to each other and forming a parasitic diode, wherein it further comprises an oxide layer realized above said first and second wells and suitably configured so as to define a contact area of said first base contact well having a shorter length than a length of said first well, as well as an electric contact layer, formed above said oxide layer and in direct contact with said first base contact well in correspondence with said contact area.

The features and advantages of the method, of the bipolar transistor and of the power actuator will be apparent from the following description of an embodiment thereof given by way of indicative and non limiting example with reference to the annexed drawings.

BRIEF DESCRIPTION OF THE SEVERAL VIEWS OF THE DRAWINGS

In these drawings:

FIGS. 1A and 1B show an equivalent circuit of an ESBT® power actuator and its symbol.

FIG. 2 schematically shows a section view of an elemental cell of the monolithically integrated power actuator of FIG. 1;

DETAILED DESCRIPTION

Figure 3A:
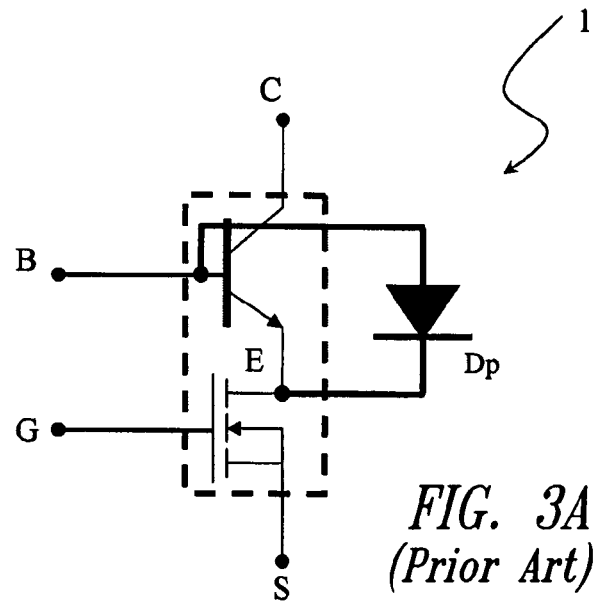
FIGS. 3A and 3B show an equivalent circuit of a portion of the power actuator of FIG. 2 and a section thereof, respectively.
Figure 3B:
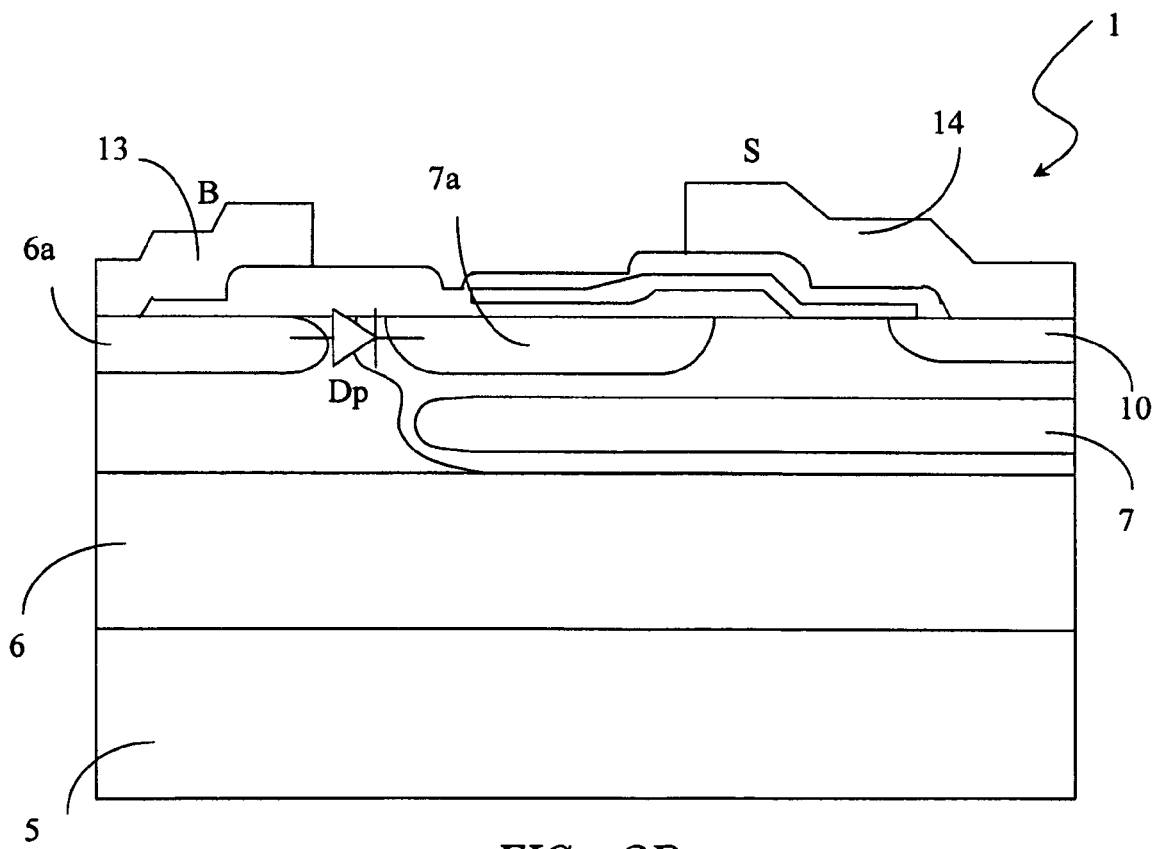
Figure 4A:
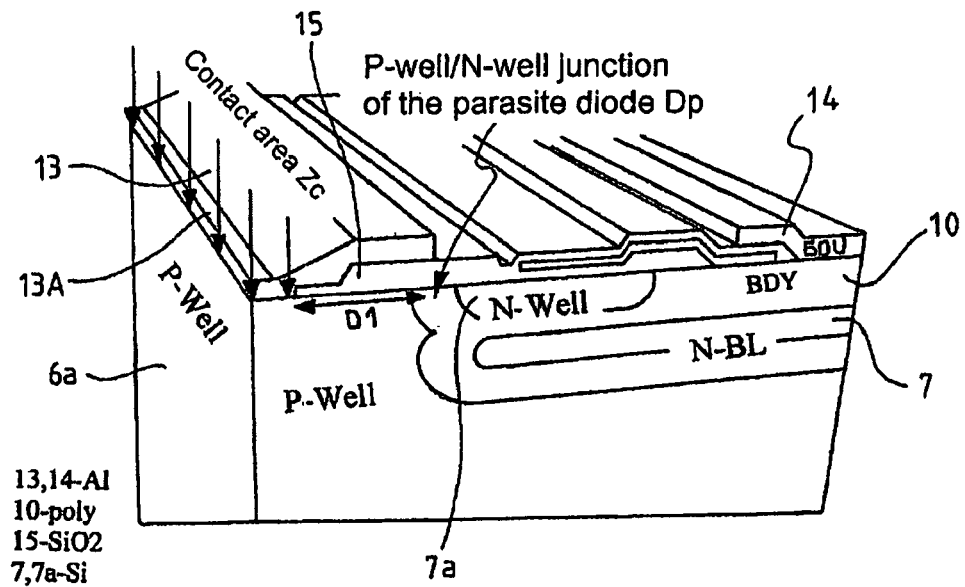
FIG. 4A schematically shows a perspective view of an integrated structure of a power actuator of the known type, in particular a portion thereof in correspondence with a base contact terminal.
Figure 4B:
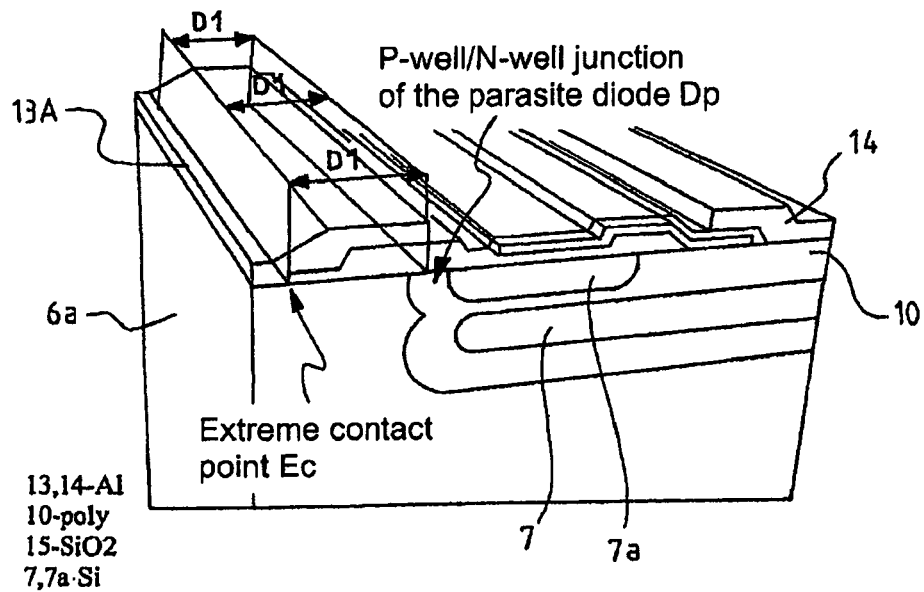
FIG. 4B schematically shows a perspective view of the integrated structure of FIG. 4A, wherein the contact distance of the base contact has been highlighted through elimination of portions overhanging it.
Figure 5A:
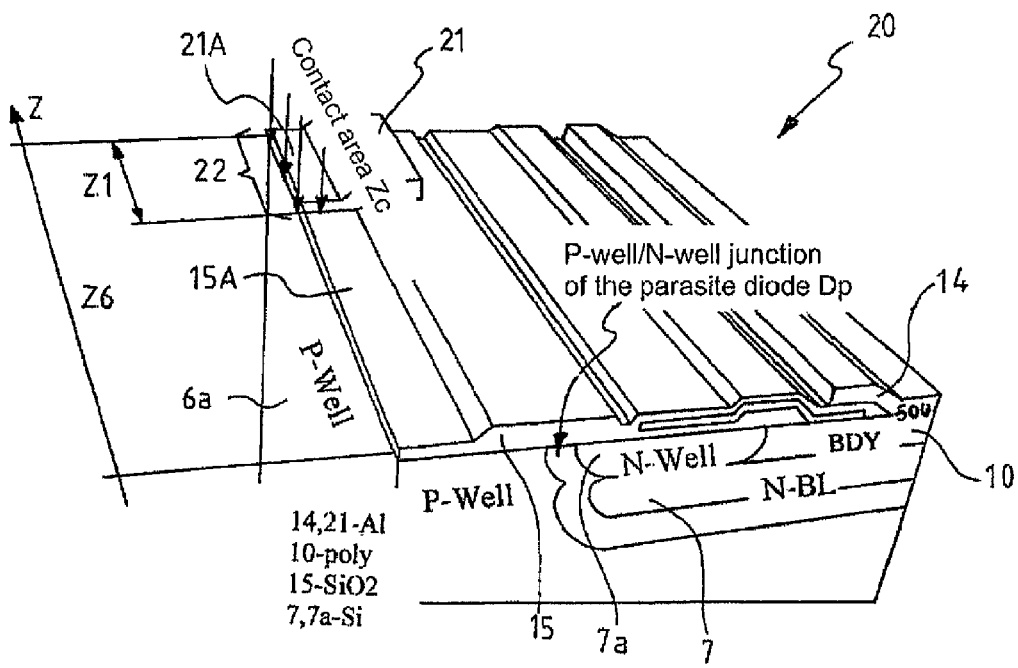
FIG. 5A schematically shows a perspective view of an integrated structure of a bipolar transistor comprised in a power actuator in correspondence with a base contact terminal thereof.
Figure 5B:
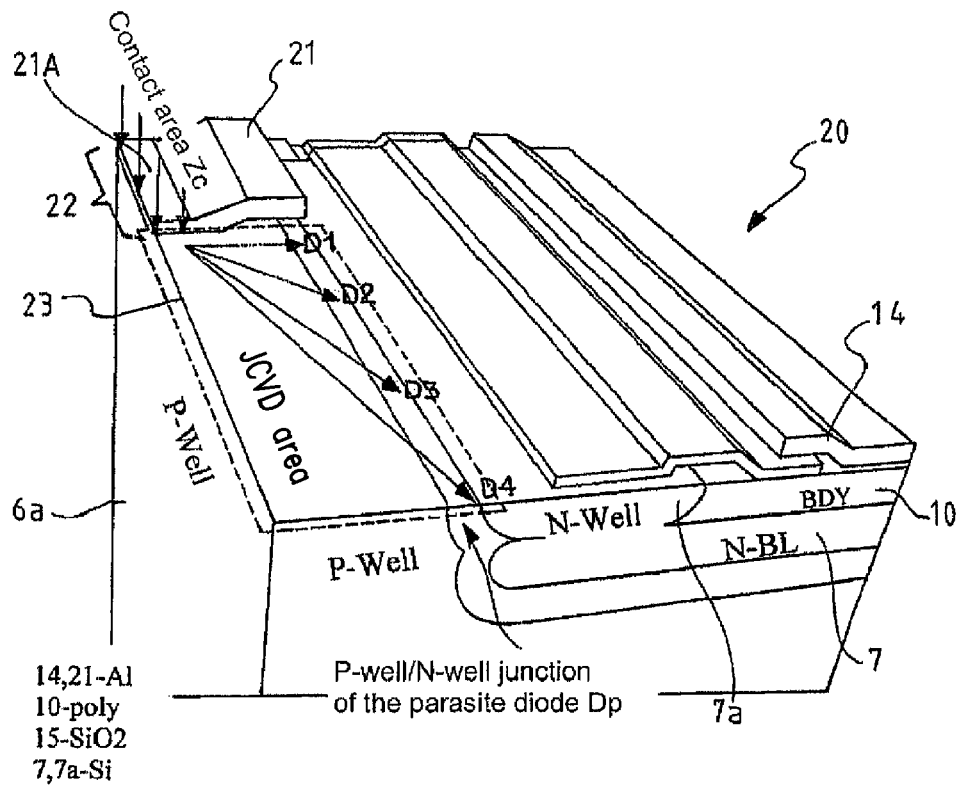
FIG. 5B schematically shows a perspective view of the integrated structure of FIG. 5A, in a further enlarged scale, wherein the contact variable distance of the base contact has been highlighted through elimination of portions overhanging it.

With reference to these figures, and in particular to FIGS. 5A and 5B, 20 globally and schematically indicates a power actuator realized according to one embodiment, in particular a portion thereof in correspondence with a base contact terminal B of the bipolar transistor comprised therein.

By way of illustration, elements being structurally and functionally identical with respect to the power actuator described with reference to the prior art will be given the same reference numbers.

Moreover, the figures showing schematic views of portions of an integrated structure are not drawn to scale, but are instead drawn so as to highlight important features.

It is suitable to underline that the considerations reported hereafter can be applied, in the same way, to a generic contact of a well of a first type of dopant integrated in a semiconductor substrate next to a further well of a second type of dopant and forming with it a parasitic diode and one embodiment proposes a method for realizing a contact of this well able to reduce the current transported by this parasitic diode, in particular realizing a contact resistance in series with this parasitic diode.

For understanding the method as proposed, hereafter the operation of a power actuator, indicated with 20, of the emitter-switched type is analyzed, the same comprising a high voltage bipolar transistor 2 and a low voltage DMOS transistor 3 connected in "cascode" configuration. In this way, the power actuator 20 has a collector terminal C, a base terminal B, a gate terminal G and a source terminal S and its equivalent electrical representation is thus the one shown in FIG. 1.

Advantageously, the power actuator 20 is realized by means of a structure integrated on a semiconductor substrate.

In particular, as seen in connection with the prior art, above the substrate, a first layer heavily doped with a first type of dopant, in particular N, is realized, overhung by a second layer lightly doped with the first type of dopant N, commonly indicated as drift layer.

Above the drift layer, a first buried layer of a second type of dopant, in particular P, is also realized wherein a second buried layer of the first type of dopant N is then realized, in turn overhung by an epitaxial layer of the first type of dopant N.

In the epitaxial layer a first and a second well of the first type of dopant N and having low resistivity are realized suitable for contacting the second buried layer.

This second buried layer and the wells realized in the epitaxial layer enclose a portion of the epitaxial layer itself wherein at least one island of the second type of dopant P, in particular a body island, is realized wherein active areas of an elemental cell, i.e., of the DMOS transistor, are suitably realized.

A second contact structure is realized above the epitaxial layer enclosed by the wells realized in the epitaxial layer itself, in correspondence with a tunnel region of the elemental cell of the DMOS type.

In particular, FIG. 5A shows a portion of the integrated structure of the power actuator 20 in correspondence with its base terminal B, where the base contact well 6a, the emitter contact well 7a realized above the second buried layer 7, as well as the body island 10 also realized above the second buried layer 7, are highlighted and indicated.

The power actuator 20 then comprises an oxide layer 15 formed above the wells 6a and 7a and at least one portion of the first island 10 as well as a metallization layer 14 formed above and in contact with a further portion of the first island 10 for realizing a source contact of the elemental cell DMOS.

As seen in connection with the prior art, the P-well/N-well junction of the base contact well 6a and of the emitter contact well 7a forms a parasitic diode Dp which contributes, with its parasitic current, to the degradation of the performances of the power actuator 20 as a whole. This parasitic diode Dp is also present in a generic bipolar transistor integrated in semiconductor substrate, which comprises, as well known, a base contact well and an emitter contact well next to each other.

It is possible to easily verify that, Ib indicating a current supplied from outside to the base terminal of the power actuator 20 and this current Ib being considered as a constant, it is possible to approximate this one as:

$$Ib = I_{Dp} + I_{b1}$$

where $I_{Dp}$ is a current flowing through the parasitic diode Dp and $I_{b1}$ is a useful current, i.e., a part of this current Ib which really serves the bipolar transistor of the power actuator 20.

It is also verified that the current $I_{Dp}$ of the parasitic diode Dp, under direct bias conditions, can, quite approximately, be qualified as the sum of the diffusion currents $I_{diff}$ of the carriers in the two regions P-Well and N-Well of its junction, i.e.:

$$I_{Dp} \approx I_{diff(p)} + I_{diff(n)}$$

It is then immediate to deduce that, the current Ib supplied to the base terminal being equal, a reduction of the diffusion current $I_{diff(n)}$ would then imply a reduction of the current $I_{Dp}$ of the parasitic diode Dp and then, by compensation, the current Ib being a constant, a greater useful current $I_{b1}$ would be obtained.

Moreover, the amount of electrons withdrawn from the diffusion current Idiff(n) would become part of that electrons current that, crossing the base region of the bipolar transistor, will flow no more towards the base contact on the well 6a (Pwell) while towards the collector region, in particular the drift layer, thus contributing to the current of the emitter terminal of the bipolar transistor, and not to that of the parasitic diode Dp.

Advantageously, a method is then proposed for realizing a contact of the base contact well 6a able to reduce the parasitic current of the parasitic diode Dp formed by the base contact well 6a and by the emitter contact well 7a, actually realizing a contact resistance in series with this parasitic diode.

One embodiment is a method for realizing a contact of a first well of a first type of dopant integrated in a semiconductor substrate next to a second well of a second type of dopant and forming with it a parasitic diode. Making reference to FIGS. 5A and 5B, the base contact well 6a and the emitter contact well 7a which form the parasitic diode Dp are considered.

The method thus comprises the steps of:
formation of the first well 6a of a first type of dopant;
formation of the second well 7a of a second type of dopant next to the first well and forming with it the parasitic diode Dp;
definition of an oxide layer 15 above the first and second wells, 6a and 7a; and
formation of an electric contact layer, in particular a metallization layer 21 above the oxide layer 15 in correspondence with the first well 6a for realizing an electric contact of this first well 6a.

Advantageously, the definition step of the oxide layer 15 further comprises a definition step of this oxide layer 15 above the whole first well 6a as well as a removal step of at least one portion of this oxide layer 15 in correspondence with a contact area 22 of the first well 6a having a length Z1 shorter than a length Z6 of this first well 6a.

Further, this removal step of at least one portion of the oxide layer 15 is realized by means of a photolithographic etching step using a suitable contact mask, drawn so as to leave exposed this portion of the oxide layer 15 to be removed.

It is suitable to note that this contact mask, contrary to what occurs in the known integration processes, comprises chessboard-like openings and not with continuous stripes, in particular coaxial to the doped regions which realize the base and emitter regions, in the case for example of a bipolar transistor.

In this way, in fact, a contact area 22 is defined with a limited length Z1 and then, thanks to the contact with the overhanging metallization layer 21, a contact resistance of the base terminal in series with the parasitic diode Dp, which is thus inhibited.

In fact, this contact resistance is realized by the contact between the silicon of the base contact well 6a and the metal of a portion 21A of the metallization layer 21 only in correspondence with the contact area 22 and is thus of smaller size than the contact resistances normally realized by means of known photolithographic techniques using stripes masks. In particular, the formation step of the metallization layer 21 above the oxide layer 15 in correspondence with the contact area 22 defines a contact resistance in series with the parasitic diode Dp realized by the portion 21A of the metallization layer and by a portion of the first well 6a in correspondence with the contact area 22 in direct contact with each other.

In a preferred embodiment, the removal step of the oxide layer 15 defines the contact area 22 of the well 6a having a length Z1 equal to a fourth of the length Z6 of the first well 6a.

Advantageously, thus an area 23 is also defined above the first well 6a, protected by the oxide layer 15, wherein the contact distance with the second well 7a has a variable length (indicated with D1-D4 in FIG. 5A). It is suitable to note that in the area 23 the metallization layer 21 is not in contact with the base contact well 6a.

It is also suitable to note that, although FIGS. 5A and 5B show the metallization layer 21 only above the contact area 22 to highlight the underlying layers, it is obviously developed above the whole length of the first well 6a, only a contact portion 21A thereof in correspondence with the contact area 22 for a size equal to the length Z1 realizing the contact resistance.

The method proposed is advantageously applied in the realization of a base contact of a bipolar transistor integrated in a semiconductor substrate, in particular inserted in a power actuator 20 of the ESBT® type.

One embodiment is a bipolar transistor, of the type comprising a first buried layer 6 realized in this semiconductor substrate 5 and having function of base region, a second buried layer 7 realized in this first buried layer 6 and having function of emitter region, as well as a base contact well 6a and an emitter contact well 7a adjacent to each other.

Advantageously, the bipolar transistor also comprises an oxide layer 15 realized above the wells 6a and 7a and suitably configured so as to define a contact area 22 of the base contact well 6a, as well as a metallization layer 21, formed above this oxide layer 15 and in direct contact with the base contact well 6a in correspondence with the contact area 22 having a length Z1 shorter than a length Z6 of this first well 6a.

In this way, the bipolar transistor comprises a contact resistance in series with the parasitic diode Dp realized by a portion 21A of the metallization layer 21 and a portion of the first base contact well 6a in correspondence with the contact area 22 in direct contact with each other.

In a preferred embodiment, the contact area 22 of the base contact well 6a has a length Z1 equal to a fourth of the length Z6 of the base contact well 6a itself.

One embodiment is a power actuator 20 formed by at least one high voltage bipolar transistor 2 and by a low voltage DMOS transistor 3 connected in "cascode" configuration, this bipolar transistor 2 comprising a first buried layer 6 realized in this semiconductor substrate 5 and having function of base region, a second buried layer 7 realized in this first buried layer 6 and having function of emitter region, as well as a base contact well 6a and an emitter contact well 7a adjacent to each other.

Advantageously, the power actuator 20 also comprises an oxide layer 15 realized above the wells 6a and 7a and suitably configured so as to define a contact area 22 of the base contact well 6a, as well as a metallization layer 21, formed above this oxide layer 15 and in direct contact with the base contact well 6a in correspondence with the contact area 22 having a length Z1 shorter than a length Z6 of this first well 6a.

The power actuator 20 then comprises a contact resistance in series with the parasitic diode Dp realized by a portion 21A of the metallization layer 21 and a portion of the first base contact well 6a in correspondence with the contact area 22 in direct contact to each other.

In a preferred embodiment, the contact area 22 of the base contact well 6a has a length Z1 equal to a fourth of the length Z6 of the base contact well 6a itself.

Considering then a base contact well 6a of a bipolar transistor, in particular inserted in a power actuator 20 as shown above, it occurs that the proposed method exactly acts on the diffusion current of carriers n (Idiff(n)) of the parasitic diode Dp to increase the current capacity of the power actuator 20 as a 5 whole.

In particular, considering that this diffusion current of carriers n is equal to:

$$I_{diff(n)} \propto 1/L \quad (1)$$

where L is the distance between the Pwell/Nwell junction of the parasitic diode Dp and the base contact on the well 6a (Pwell), the power actuator 20 advantageously maximizes this value L without jeopardizing or modifying the other design parameters like the emitter area/perimeter or other geometric parameters (such as the so called die-size) nor the less the electric performances in terms of resistance at the switch-on (Ron) or of RBSOA (acronym of: "Reverse Biased Safe Operating Area").

In order to better illustrate this contact area Zc, in FIG. 5B, the integrated structure of the power actuator 20 has been shown making the oxide layer 15 transparent.

It is thus immediate to verify that the distance of the P-well/N-well junction (which forms the parasitic diode Dp) from the contact area Zc on the P-well 6a is no longer a fixed measure, like in the case of the standard layout, but it becomes variable across the structure (as indicated by the values D1-D4 in FIG. 5B). In particular, this distance is greater for those areas of the integrated structures more distant from the contact area Zc on the well P-well 6a. This technique can be thus defined as "Junction to Contact Variable Distance" or JCVD.

An area highlighted as JCVD, i.e., the protected area 23, is thus created wherein, according to the above reported relation (1), a lower diffusion current of carriers n (Idiff(n)) results with respect to the prior art solutions. In substance, the power actuator 20 shows a greater current capacity with respect to the prior art solutions.

Data obtained from electric simulations carried out by the Applicant, by applying the method to a power actuator commercialized with the acronym ESBT ES42, have fully proved the improvement provisions with an increase of the device capacity of about 20%.

In substance, a method has been proposed for realizing a contact of a first well of a first type of dopant integrated in a semiconductor substrate next to a second well of a second type of dopant and forming with it a parasitic diode suitable for reducing the parasitic current of this diode, realizing a contact resistance in series with this diode.

One embodiment also proposes a bipolar transistor, in particular inserted in a power actuator, and having a base contact reduced in correspondence with the base contact well and thus with improved performances in terms of current capacity.

It is finally suitable to note that the solution proposed is of simple implementation and does not imply any additional cost apart from the design of a mask for realizing the contact, in particular, the configuration of the oxide layer 15 with realization of the contact area 22.

Moreover, the proposed method is advantageously applied also to power bipolar transistors (BJT), for reducing the sizes of the so called base fingers, maintaining the same efficiency of the integrated structure as a whole, and then using the space thus recovered as emitter area, i.e., obtaining, being the silicon area identical, a further current gain.

Advantageously, the proposed method, by using the above shown JCVD technique, improves the efficiency of a device of the ESBT® (Emitter-Switched Bipolar Transistor) type, through inhibition of a parasitic component placed between the base terminal and the source one, in particular realizing a contact resistance in series with this parasitic component.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A bipolar transistor, comprising:
a base region that includes a first buried layer realized in a semiconductor substrate;
an emitter region that includes a second buried layer realized in said first buried layer;
a base contact well and an emitter contact well adjacent to each other and forming a parasitic diode;
an insulating layer realized above said base contact and emitter contact wells and suitably configured so as to define a contact area of said base contact well having shorter length than a length of said base contact well; and
an electric contact layer, formed above said insulating layer and in direct contact with said contact area of said base contact well.

2. A bipolar transistor according to claim 1, wherein a portion of said electric contact layer and a portion of said base contact well in correspondence with said contact area form a contact resistance in series with said parasitic diode.

3. A bipolar transistor according to claim 2, wherein the length of said contact area of said base contact well is a fourth of said length of said base contact well.

4. A bipolar transistor according to claim 3, wherein said insulating layer is an oxide layer.

5. An emitter-switched power actuator, comprising:
a high voltage bipolar transistor and a low voltage DMOS transistor connected in cascode configuration between a collector terminal of said bipolar transistor and a source terminal of said DMOS transistor and having respective control terminals, said high voltage bipolar transistor including:
a base region including a first buried layer realized in a semiconductor substrate;
an emitter region including a second buried layer realized in said first buried layer;
a base contact well and an emitter contact well adjacent to each other and forming a parasitic diode,
an insulating layer realized above said first and second wells and suitably configured so as to define a contact area of said base contact well having a shorter length than a length of said base contact well; and
an electric contact layer, formed above said insulating layer and in direct contact with contact area of said first base contact well.

6. A power actuator according to claim 5, wherein a portion of said electric contact layer and a portion of said base contact well in correspondence with said contact area form a contact resistance in series with said parasitic diode.

7. A power actuator according to claim 6, wherein the length of said contact area of said base contact well is a fourth of said length of said first base contact well.

8. A power actuator according to claim 7, wherein said insulating layer is an oxide layer.

9. A bipolar transistor, comprising:
a base region that includes a first buried layer realized in a semiconductor substrate;
an emitter region that includes a second buried layer realized in said first buried layer;
a base contact well and an emitter contact well adjacent to each other and forming a parasitic diode;
an insulating layer formed on said base contact and emitter contact wells and configured to define a contact area of said base contact well having a shorter length than a length of said base contact well; and
an electric contact layer in direct contact with said contact area of said base contact well.

10. A bipolar transistor according to claim 9, wherein a portion of said electric contact layer and a portion of said base contact well in correspondence with said contact area form a contact resistance in series with said parasitic diode.

11. A bipolar transistor according to claim 9, wherein the length of said contact area of said base contact well is a fourth of said length of said base contact well.

* * * * *